(12) United States Patent
Berkcan et al.

(10) Patent No.: US 10,254,323 B2
(45) Date of Patent: Apr. 9, 2019

(54) PASSIVE WIRELESS MONITORING OF INDIVIDUAL CAPACITOR CANS

(71) Applicant: General Electric Company, Schenectady, NY (US)

(72) Inventors: Ertugrul Berkcan, Clifton Park, NY (US); Mark Gerard Adamiak, Paoli, PA (US); Karim Younsi, Ballston Lake, NY (US); Sachin N. Dekate, Niskayuna, NY (US); Kamala C. Raghavan, Schenectady, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/199,293

(22) Filed: Jun. 30, 2016

(65) Prior Publication Data

US 2018/0003751 A1    Jan. 4, 2018

(51) Int. Cl.
*H03F 1/54*      (2006.01)
*G01K 7/01*      (2006.01)
(Continued)

(52) U.S. Cl.
CPC ....... *G01R 27/2605* (2013.01); *G01R 31/028* (2013.01); *G01R 31/3689* (2013.01);
(Continued)

(58) Field of Classification Search
CPC .................................................. G01R 27/2605
See application file for complete search history.

(56) References Cited

U.S. PATENT DOCUMENTS 6,753,792 B2    6/2004   Beckwith
7,667,353 B2    2/2010   Coolidge et al.
(Continued)

FOREIGN PATENT DOCUMENTS

CN     104111392 A    10/2014
CN     204389611 U    6/2015
(Continued)

OTHER PUBLICATIONS

Mielke, Angela M., et al.; "Continuous monitoring of a capacitor bank", Instrumentation & Measurement Magazine, IEEE, vol. 4, Issue: 4, pp. 14-19, Dec. 2001.
(Continued)

*Primary Examiner* — Joseph H Feild
*Assistant Examiner* — Pameshanand Mahase
(74) *Attorney, Agent, or Firm* — GE Global Patent Operation; Nitin Joshi

(57) ABSTRACT

A monitoring system includes a capacitor can having one or more capacitors. The monitoring system includes an antenna. The monitoring system includes at least one sensor disposed within the capacitor can and configured to detect an operating characteristic associated with health of the one or more capacitors of the capacitor can. The monitoring system includes a processor configured to receive a first signal from the at least one sensor indicative of the operating characteristic. The processor is configured to send a second signal, via the antenna, indicative of a value of the operating characteristic to a receiving device outside of the capacitor can.

20 Claims, 4 Drawing Sheets

(51) Int. Cl.
  *G01D 1/18* (2006.01)
  *G01R 27/26* (2006.01)
  *G08B 21/18* (2006.01)
  *G08C 23/04* (2006.01)
  *G08C 23/06* (2006.01)
  *H04B 10/071* (2013.01)
  *G01R 31/36* (2019.01)
  *G01R 31/02* (2006.01)
  *H01G 9/14* (2006.01)
  *H02H 7/16* (2006.01)
  *H02J 3/18* (2006.01)

(52) U.S. Cl.
  CPC .......... *G08B 21/182* (2013.01); *G08C 23/04* (2013.01); *G08C 23/06* (2013.01); *H01G 9/14* (2013.01); *H02H 7/16* (2013.01); *H02J 3/18* (2013.01); *H04B 10/071* (2013.01); *Y02E 40/30* (2013.01)

(56) References Cited

U.S. PATENT DOCUMENTS

| | | | | |
|---|---|---|---|---|
| 9,203,122 | B2* | 12/2015 | Raghavan | H01M 10/48 |
| 9,209,494 | B2* | 12/2015 | Kiesel | H01M 10/42 |
| 9,372,237 | B2* | 6/2016 | Choi | H01M 10/482 |
| 2004/0021568 | A1* | 2/2004 | Seal | G01R 22/066 |
| | | | | 340/551 |
| 2005/0058460 | A1* | 3/2005 | Wang | H04B 10/503 |
| | | | | 398/195 |
| 2009/0231764 | A1* | 9/2009 | Banting | H02H 7/16 |
| | | | | 361/15 |
| 2012/0278012 | A1 | 11/2012 | Ganesh et al. | |
| 2013/0119923 | A1 | 5/2013 | Wright et al. | |
| 2013/0222006 | A1* | 8/2013 | Weiss | G01R 31/3016 |
| | | | | 324/762.01 |
| 2013/0314094 | A1* | 11/2013 | Farmer | G01N 25/20 |
| | | | | 324/430 |
| 2014/0114592 | A1 | 4/2014 | Eilertsen | |
| 2015/0300673 | A1* | 10/2015 | Dodds | F24F 11/0008 |
| | | | | 62/91 |
| 2017/0179721 | A1 | 6/2017 | Wang | |

FOREIGN PATENT DOCUMENTS

| | | |
|---|---|---|
| KR | 100821643 B1 | 4/2008 |
| WO | 2015117557 A1 | 8/2015 |

OTHER PUBLICATIONS

Perera-Liuna, Alexandre, et al.; "Automatic capacitor bank identification in power distribution systems", Electric Power Systems Research, vol. 111, pp. 96-102, Jun. 2014.

European Search Report and Opinion issued in connection with corresponding EP Application No. 17174807.2 dated Nov. 13, 2017.

\* cited by examiner

PASSIVE WIRELESS MONITORING OF INDIVIDUAL CAPACITOR CANS

BACKGROUND

The subject matter disclosed herein relates to capacitor monitoring, and more particularly, to monitoring health of capacitors in a capacitor bank.

Capacitor banks may be used for a variety of purposes in power systems, such as regulating reactive power/voltage level, reducing harmonics, and the like. For example, a power grid may include one or more inductive loads, such as appliances, motors, and the like, that result in reactive power flow. The reactive power may reduce the quality of power delivered to loads on the power grid. As such, substations, for example, may include one or more capacitor banks to regulate the reactive power, thereby improving the quality of power provided to the loads.

However, the capacitor bank may wear over time due to various factors, such as insulation deterioration, overheating, and aging, among others. As such, wear to the capacitor banks may reduce the reliability of the power system. Accordingly, improved systems and techniques for monitoring capacitor banks are desirable.

BRIEF DESCRIPTION

Certain embodiments commensurate in scope with the originally claimed disclosure are summarized below. These embodiments are not intended to limit the scope of the claimed disclosure, but rather these embodiments are intended only to provide a brief summary of possible forms of the disclosure. Indeed, embodiments may encompass a variety of forms that may be similar to or different from the embodiments set forth below.

In a first embodiment, a monitoring system a capacitor can having one or more capacitors, an antenna, an at least one sensor disposed within the capacitor can and configured to detect an operating characteristic associated with health of the one or more capacitors of the capacitor can, and a processor configured to receive a first signal from the at least one sensor indicative of the operating characteristic and to send a second signal, via the antenna, indicative of a value of the operating characteristic to a receiving device outside of the capacitor can.

In a second embodiment, a method includes receiving, via a processor, a first signal from at least one sensor indicative of an operating characteristic associated with health of one or more capacitors within the capacitor can, and sending, via the processor, a second set of signals indicative of values of the operating characteristic to a receiving device outside of the capacitor can.

In a third embodiment, a system includes a first monitoring system configured to monitor a first capacitor can of a plurality of capacitor cans in a capacitor bank, wherein the first monitoring system includes at least one sensor configured to detect an operating characteristic associated with health of the first capacitor can and to output a sensor signal indicative of the operating characteristic, and a processor operatively coupled to a memory, wherein the processor is configured to receive the sensor signal from the at least one sensor, and control an optical signal between the first capacitor can and a second capacitor can to indicate the health of the first capacitor can.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

The subject matter disclosed herein relates to monitoring capacitor cans of a capacitor bank. A capacitor bank may be electrically coupled to a power grid (e.g., at an electrical substation) to regulate reactive power on the power grid. The capacitor bank may include one or more capacitor cans, and each of the capacitor cans may include one or more capacitors. For a number of reasons, the capacitor bank may not provide a desired capacitance to the power grid. For instance, one or more individual capacitor cans within the capacitor bank may deteriorate and cause the capacitor bank to have a reduced capacitance. In addition to deterioration, capacitors may have short circuits, physical damage, exceeded design limitation voltages, or the like, thereby limiting the ability of the capacitor bank to perform its function. In the event of reduced capacitance of the capacitor bank, the reliability of the power grid may be reduced and the ability of the string of capacitors to withstand the designed voltage may be compromised. To improve the reliability of the power grid when the capacitor bank is not operating as designed, an operator may halt the system, take the capacitor cans off-line (e.g., disconnected from operation), and test each of the capacitor cans to identify the capacitor can that may not be operating as desired. The process of removing and testing the capacitor cans may be time consuming and result in increased downtime of the capacitor bank and degraded performance of the power grid. To improve reliability of the power grid and/or to reduce downtime of the capacitor bank, a monitoring system may be used to monitor the capacitor cans of the capacitor bank while the capacitor cans are on-line (e.g., in operation on the power grid).

With the foregoing in mind, in certain embodiments, the monitoring system for monitoring capacitor cans of a capacitor bank may include a processor operatively coupled to a memory that may receive a first signal from a sensor indicative of an operating characteristic associated with health of one or more capacitors within the capacitor can. The processor may send a second signal indicative of a value associated with the operating characteristic to a device outside of the capacitor can. As a result, health of the capacitor can may be dynamically determined.

Figure 1:
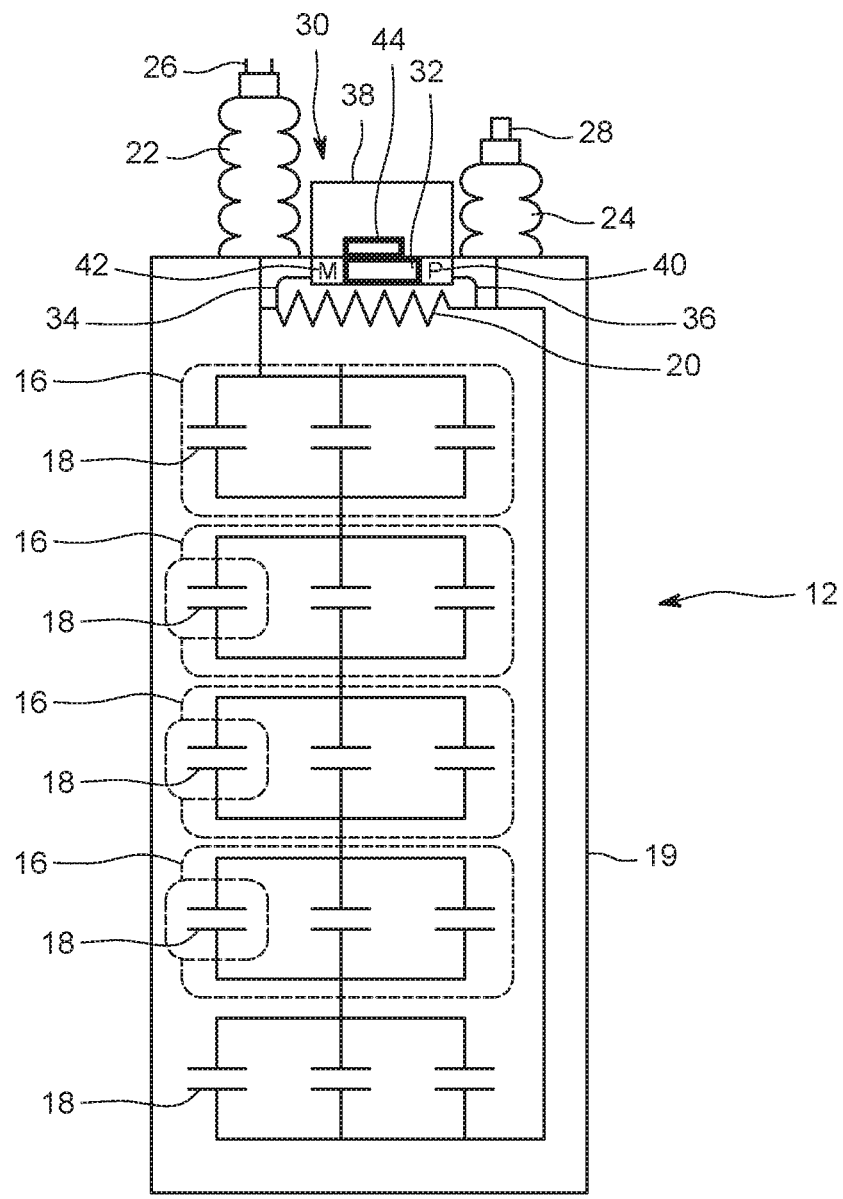
FIG. 1 is a schematic diagram of a monitoring system that monitors operation of a capacitor can, in accordance with an embodiment.

By way of introduction, FIG. 1 shows a diagram of a capacitor bank system 10 of a three phase power system that includes a capacitor can 12. The capacitor can 12 may include one or more groups 16 of capacitors 18. The capacitor can 12 may include a body 19 to seal the one or more capacitors 18 within the capacitor can 12. While five groups 16 of three capacitors 18 are shown in FIG. 1, the capacitor can 12 of FIG. 1 is meant to be illustrative, and a capacitor can/may include any suitable number of capacitors which may be used and/or grouped in any suitable way. Further, while the capacitor bank system 10 in FIG. 1 includes the capacitor can 12, the capacitor bank system 10 may include any suitable number of capacitor cans 12. The capacitors 18 in the capacitor can 12 may be coupled to each other in series, in parallel, or in any suitable combination to generate a desired capacitance and voltage level for the capacitor bank system 10.

Further, the capacitor can 12 may include a drain resistor 20 coupled to the capacitors 18 to discharge the capacitors 18 over a period of time if the capacitor is taken offline. In some embodiments, the capacitor can 12 may include a first bushing 22 and a second bushing 24 to isolate from ground a first terminal 26 and a second terminal 28 of the capacitor can 12, respectively. The first terminal 26 and the second terminal 28 may be coupled to the power system or to one or more other capacitor cans in series, in parallel, or in any suitable combination thereof.

The capacitor can 12 may include a monitoring system 30 that may monitor health of the capacitor can 12. The monitoring system 30 may include a sensor disposed (e.g., mounted) within the capacitor can 12 that may detect an operating characteristic associated with health of one or more capacitors 18 within the capacitor can 12. The operating characteristic may be any suitable physical or electrical property indicative of operation of the capacitor can 12, such as a voltage across the capacitor can 12, current through one or more capacitors of the capacitor can 12, a temperature of the capacitor can 12, pressure within the capacitor can 12, gas in the capacitor can, or the like. In the illustrated embodiment, the monitoring system 30 includes a passive sensor, such as voltage sensor 32, having a first probe 34 and a second probe 36 coupled across the drain resistor 20 to detect a voltage across the drain resistor 20. A passive sensor may be a sensor that does not require power but rather responds to radio-based data probes to emit signals to detect the operating characteristic. While the illustrated embodiment includes a voltage sensor 32 to detect the operating characteristic, other sensors may be used to detect other operating characteristics. In certain embodiments, the voltage sensor 32 may monitor voltages across the groups 16 of the capacitors 18, a current sensor may monitor a current through the drain resistor 20, current into one or more of the capacitors 18, or the groups 16 of the capacitors 18 with both voltage and current sampled in relative synchronism for the computation of power factor, a temperature sensor may monitor a temperature within the capacitor can 12, an acoustic sensor may monitor an acoustic effect on the capacitor can 12, a pressure sensor may monitor a pressure within the capacitor can 12, an optical sensor may monitor pressure, vibration, and gas content, or any other suitable sensor may be used to monitor the health of the one or more capacitors 18 of the capacitor can 12.

The monitoring system 30 may include circuitry to monitor the health of the one or more capacitors 18 of the capacitor can 12. For example, the monitoring system 30 may include an integrated circuit (IC) 38, such as a SL900A available from AMS of Premstaetten, Austria. The IC 38 may include a processor 40 and memory 42. While the processor 40 will be used throughout this disclosure, as one of ordinary skill in the art will appreciate, multiple processors may be used by the monitoring system 30. The processor 40 may be operatively coupled to the memory 42 to execute instructions for carrying out the presently disclosed techniques. These instructions may be encoded in programs or code stored in a tangible non-transitory computer-readable medium, such as the memory 42 and/or other storage. The processor 40 may be a general purpose processor, system-on-chip (SoC) device, application-specific integrated circuit, or some other processor configuration. The memory 42, in the embodiment, includes a computer readable medium, such as, without limitation, a hard disk drive, a solid state drive, a diskette, a flash drive, a compact disc, a digital video disc, a random access memory (RAM), an electrically erasable programmable read-only memory (EEPROM), and/or any suitable storage device that enables the processor 40 to store, retrieve, and/or execute instructions and/or data.

In the illustrated embodiment, the IC 38 includes an antenna 44, such as a patch antenna, disposed (e.g., mounted) on a ceramic surface on an exterior of the capacitor can 12 (e.g., between the first bushing 22 and the second bushing 24), the antenna 44 may send a signal to a receiving device. While the antenna 44 is mounted on the exterior of the capacitor can 12 in FIG. 1, this is merely an example. In other embodiments, the antenna 44 may transmit data through the insulation of the capacitor can 12 or through modulation of data over the power line. In some embodiments, the IC 38, the antenna 44, the sensors, or a combination thereof, may be conformal coated to protect the monitoring system 30 from the environment of the capacitor can 12.

Figure 2:
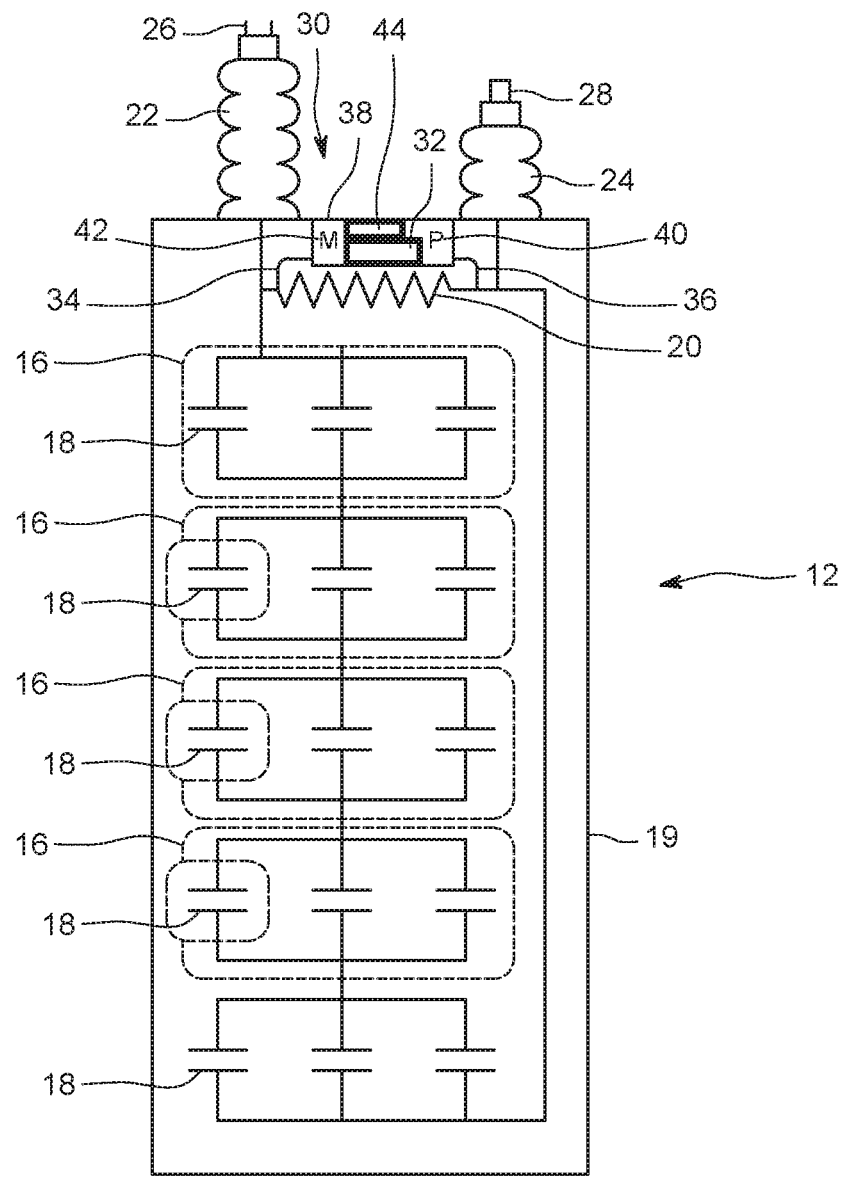
FIG. 2 is a schematic diagram of another embodiment of the monitoring system that monitors operation of a capacitor can with an antenna disposed on an interior of the capacitor can, in accordance with an embodiment.

FIG. 2 shows another embodiment of the monitoring system 30 having the antenna on an interior of the capacitor can 12. That is, the antenna 44 may be disposed on the exterior or an interior of the capacitor can 12. In the illustrated embodiment, the antenna 44 is disposed on the interior of the capacitor can 12 in proximity of the bushings 22 and 24. Further, the antenna 44 may be disposed within insulator housing of the capacitor can 12 or using the structure of the capacitor can 12 as an antenna 44.

Figure 3:
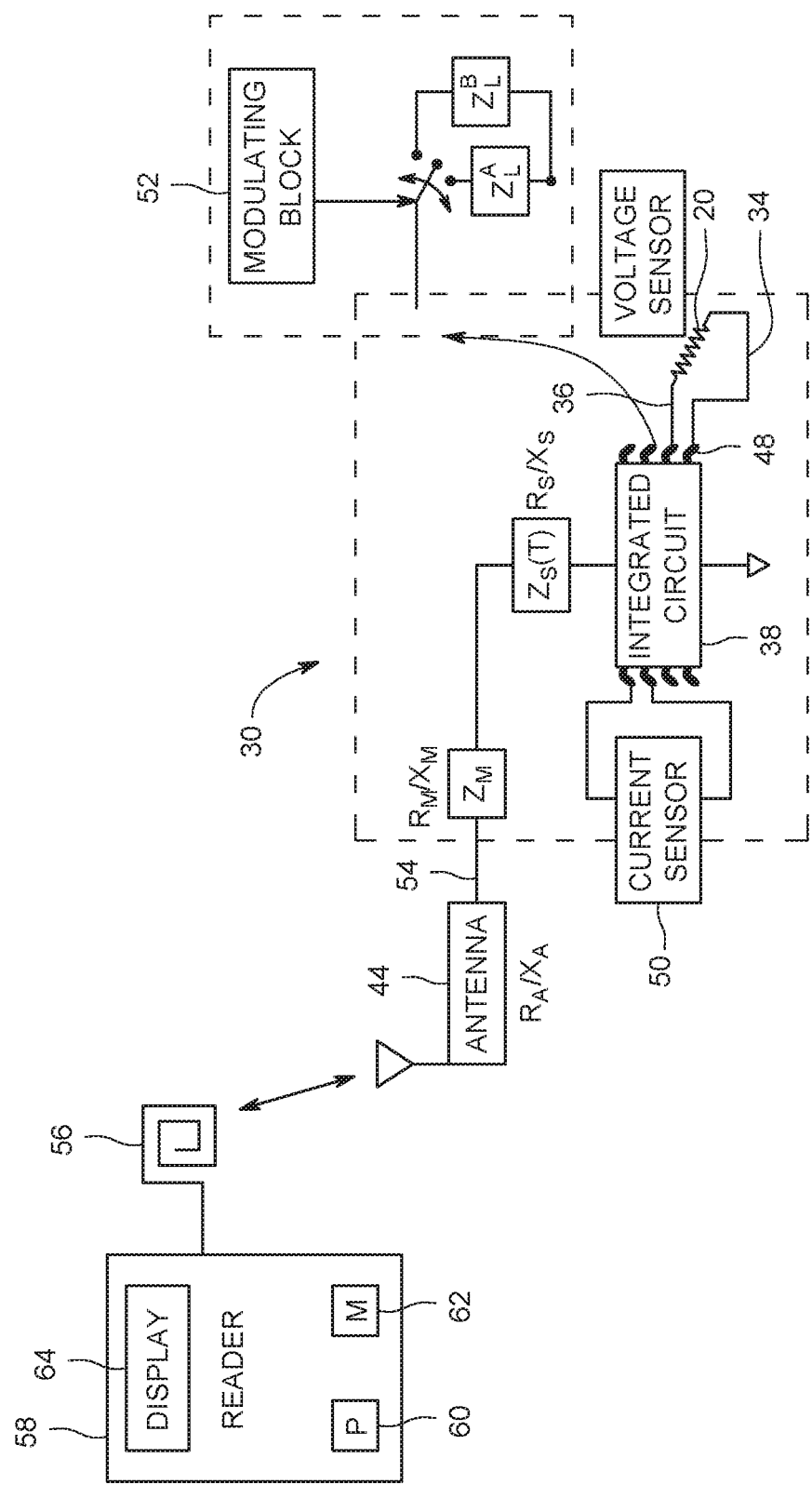
FIG. 3 is a schematic diagram of the monitoring system configured to monitor an operational parameter of the capacitor can of FIG. 1, in accordance with an embodiment.

FIG. 3 shows a diagram of the monitoring system 30 that may monitor the capacitor can 12. The monitoring system 30 may include the IC 38 having one or more inputs and/or outputs (I/O) 48 to receive and/or send signals. For example, the IC 38 may include the first and second probes 34 and 36 to sense the voltage across the drain resistor 20. Additionally and/or alternatively, the monitoring system 30 may include a current sensor 50 configured to sense current through one or more of the capacitors 18, the drain resistor 20, or the like. Signal sensing may extend into the range of Megahertz to effect failure detection through the sensing of Partial Discharge signals. For example, the signal sensing may include partial discharge signals as set forth according to the techniques disclosed by U.S. Patent Publication No. 2012/0278012, entitled "Device and Method for Detecting and Locating Defects in Underground Cables" and filed on Apr. 29, 2011, which is incorporated by reference herein in its entirety.

The IC 38 may include an analog-to-digital (ADC) converter that may receive a sensor signal (e.g., voltage, current, temperature, acoustic, etc.) from the sensors (e.g., current sensor 50, voltage probes 34 and 36, etc.) indicative of an operating characteristic associated with health of one or more capacitors 18 of the capacitor can 12. For example, the IC 38 may receive a signal indicative of a vector (e.g., magnitude and phase angle) of a voltage across the drain resistor 20, a vector of current into the capacitance or through the drain resistor 20, a temperature within the capacitor can 12, a pressure within the capacitor can 12, acoustics within the capacitor can 12, partial discharge within the capacitor can 12, or any other suitable signal. The ADC may then convert the sensor signal into a value that corresponds to the operating characteristic. For example, the ADC may convert the signals of the voltages across the drain resistor 20 into digital numbers that provide a value that corresponds to the vector of the voltage. The IC 38 may include a modulating block 52 having circuit components, such as one or more inductors and/or capacitors, of a voltage controlled oscillator. The processor 40 may obtain, via the ADC converter or a computed value, an indication of the health of the one or more capacitors 18.

The capacitor bank system 10 may include a radio frequency identifier (RFID) reader 58 that sends and/or receives radio frequency signals to communicate with the monitoring system 30. In certain embodiments, the RFID reader 58 may have a processor 60 operatively coupled to a memory 62 with various characteristics similar to the processor 40 and memory 42 described above with respect to the IC 38.

The processor 40 of the monitoring system 30 may generate and communicate (e.g., radio signal) a health signal indicative of the health (e.g., capacitance) of the one or more capacitors 18, via control of the modulating block 52, based on the value. For example, the processor 40 may send a series of radio signals having frequencies proportional to the voltage and current magnitude and relevant angle, the temperature within the capacitor can 12, the pressure within the capacitor can 12, or the like. The processor 40 may then send the health signal, having a set of frequencies based on the value of the operating characteristic, to the RFID reader 58 outside of the capacitor can 12 via the antenna 44. Further, the monitoring system 30 may include an interconnect 54 that connects the IC 38 within the capacitor can 12 to the antenna 44 on an exterior of the capacitor can 12 to enable communication outside of the capacitor can 12. The IC 38 may communicate via far field communication (e.g., greater than one, two, three, four, five or more wavelengths away from the RFID reader).

The IC 38 may transmit the health signal, via radiofrequency identification (RFID), to an antenna 56 (e.g., a patch antenna) of an RFID reader 58 to enable the RFID reader 58 to identify the health of the one or more capacitors 18 within the capacitor can 12. For example, the RFID reader 58 may include circuit components (e.g., the processor 60 and memory 62), such as capacitors and/or inductors, to demodulate the second signal and to determine the value indicative of the health based on the frequency. The RFID reader 58 may receive the second signal and to determine a value corresponding to the frequency of the health signal.

In some embodiments, the capacitor bank system 10 may include a set of capacitor cans 12 (e.g., two or more) that each include a respective monitoring system 30. The RFID reader 58 may send a polling signal indicative of a poll request to each monitoring system 30, where the poll request has an address corresponding to a respective address of the monitoring system 30 of the capacitor can 12 within the set of capacitor cans. For example, the RFID reader 58 may send a poll request signal indicating an address of one of the monitoring systems of the set of capacitor cans 12 to identify the monitoring system 30 which may respond. The monitoring systems 30 of each capacitor can of the set of capacitor cans 12 may determine if the address corresponds to an address of the respective monitoring system 30. The monitoring system 30 with the corresponding address may then sample the capacitor can 12 by receiving the sensor signal and transmitting the health signal indicating health of the capacitor can 12 by performing the steps described above. The RFID reader 58 may receive the health signal as a response to the poll request. Further, the RFID reader 58 may subsequently send additional poll requests to other addresses and receive health signals for each capacitor can of the set of capacitors 12 to determine health of the set of capacitor cans 12. While the embodiment described above uses a polling RFID reader 58, any suitable method in which the monitoring system 30 may send signals indicative of the health of the capacitors 18 may be used.

The processor 60 of the RFID reader 58 may identify capacitor cans 12 of the set of capacitor cans 12 that are in a healthy state or an unhealthy state. For example, the processor 60 may compare each of the values indicative of the health of the one or more capacitors 18 to one or more thresholds. As an example, if the magnitude of the voltage across the drain resistor 20 is below a first threshold value, the processor 60 may determine that the one or more capacitors 18 are in an unhealthy state where the capacitor cans 12 does not provide the capacitance that the capacitor can 12 is designed to provide. If the magnitude of the voltage across the drain resistor 20 is below a second threshold value, the processor 60 may determine that the one or more capacitors 18 should be replaced (e.g., in a replacement state). If the power factor, as computed from the voltage and current vectors, is outside of a settable threshold, an alarm may be set indicating the need to replace a specific capacitor can.

The processor 60 may send signal(s) to a display 64 indicating instructions to display the health state of the capacitor can 12. For example, the display 64 may display the voltage magnitude, the current magnitude, or the pressure, or the display 64 may display the determination of whether the one or more capacitors are in a replacement state. In certain embodiments, the processor 60 may send signals to the display 64 to display a mapping (e.g., color map) to an operator that identifies whether each capacitor can is in a healthy state (e.g., green), or an unhealthy state (e.g., yellow), or in a replacement state (e.g., red), thereby saving the operator time of testing each capacitor can 12 individually. Further, the RFID reader 58 may retrieve the values from each capacitor can 12 while the capacitor cans 12 are online, thereby reducing downtime of the capacitor system and minimizing operation limitations on the power grid.

Figure 4:
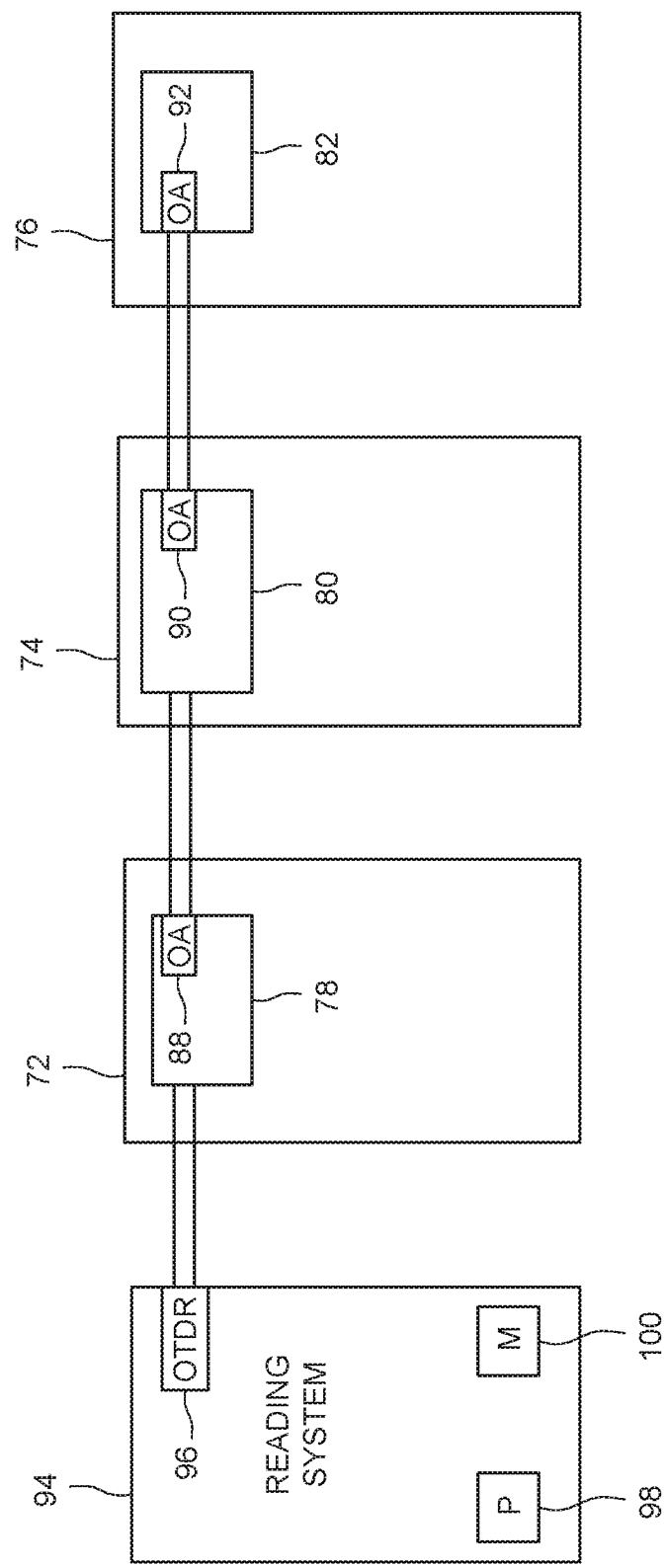
FIG. 4 is a block diagram of the monitoring system of FIG. 1 communicating with a remote reader via a communication link between the capacitor cans, in accordance with an embodiment.

As mentioned above, the monitoring system 30 may detect the health of the one or more capacitors 18 of the capacitor cans 12 in a variety of ways. FIG. 4 shows an optical detection system 70 having a set of capacitor cans 72, 74, and 76 that may each have a respective monitoring system 78, 80, and 82. In the illustrated embodiment, the optical detection system 70 may include an optical fiber 84 and 86 threaded between each of the cans to communicatively couple the monitoring systems 78, 80, and 82 with each other. Each of the monitoring systems 78, 80, and 82 may monitor the health of the respective capacitor cans 72, 74, and 76 and provide an optical signal indicative of the health of the capacitor cans 72, 74, and 76. In some embodiments, each of the monitoring systems 78, 80, and 82 may include a voltage driven optical attenuator 88, 90, 92 that controls an amount of light transmitted across the optical fiber 84 and 86 based on the voltage across the drain resistor 20. The optical fiber 84 and 86 may be daisy chained between each of the monitoring systems 78, 80, and 82 to provide optical signals to a reading system 94.

As mentioned above, while voltage is used as an example to detect an operating characteristic associated with the health of one or more capacitors 18 of the capacitor can 12, any suitable method may be used to detect an operating characteristic associated with the health of the one or more capacitors 18 of the capacitor cans 72, 74, and 76. For example, in some embodiments, the monitoring systems 78, 80, and 82 may each include a current sensor that may monitor a current into the capacitors 18 and/or the groups 16 of the respective capacitor cans 72, 74, and 76. In some embodiments, a vector measurement of voltage across the capacitor 18 and/or current into the capacitor may be determined via the monitoring systems 78, 80, and 82. In other embodiments, the monitoring systems 78, 80, and 82 may each include a temperature sensor to monitor a temperature within the respective capacitor cans 72, 74, and 76 (e.g., due to a relationship between temperature and failing capacitor cans). In certain embodiments, the monitoring systems 78, 80, and 82 may each include an acoustic sensor to monitor an acoustic effect on the respective capacitor cans 72, 74, and 76 (e.g., due to a relationship between harmonics and failing capacitor cans). In another embodiment, the monitoring systems 78, 80, and 82 may each include a pressure sensor to monitor a pressure within the respective capacitor cans 72, 74, and 76 (e.g., due to a relationship between pressure and failing capacitor cans). In yet another embodiment, the monitoring systems 78, 80, and 82 may each include a fiber optic strain gauge that detects a local strain effect on the respective capacitor cans 72, 74, and 76 indicative of the health of the capacitor cans 72, 74, and 76.

The optical detection system 70 may include a reading system 94 having an optical time-domain reflectometer (OTDR) 96 that may detect a change in the optical signal, indicative of whether each capacitor can 72, 74, and 76 is in the unhealthy or replacement state based on attenuation of light (e.g., from the optical attenuators 88, 90, and 92), at a location along the optical fiber 84 and 86 to enable an operator to identify the capacitor can in the unhealthy or failing state. The reading system 94 may include a processor 98 communicatively coupled to a memory 100 similar to the RFID reader described with respect to FIG. 3. The processor 98 of the reading system 94 may determine, via signals from the OTDR 96, which capacitor can 72, 74, and 76 is in the unhealthy state or replacement state. As mentioned above, the reading system 94 may provide an operator a health map indicative of the health of each of the capacitor cans 72, 74, and 76 and may archive the operating parameters in order to perform asset data analysis over the life of the capacitor can. For example, the processor 98 may determine which capacitor 18 is in the replacement state based on light signals scattered by the OTDR 96.

Technical effects of the disclosure include sending a signal indicative of a value of an operating characteristic associated with health of one or more capacitors of a capacitor can. A monitoring system may receive a signal from a sensor within a capacitor can of a capacitor bank. The signal may be indicative of an operating characteristic associated with health of the capacitor can. The monitoring system may send, via an antenna, a signal indicative of a value of the operating characteristic to a receiving device outside of the capacitor can. The receiving device may provide an indication of health of the capacitor can to an operator and be archived in an asset historian.

This written description uses examples to disclose various embodiments, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A monitoring system, comprising:
 a capacitor can having one or more capacitors;
 an antenna;
 an at least one sensor disposed within the capacitor can and configured to detect an operating characteristic associated with health of the one or more capacitors of the capacitor can;
 an integrated circuit (IC) configured to receive a first signal from the at least one sensor indicative of the operating characteristic and to send a second signal, via the antenna, indicative of a value of the operating characteristic to a receiving device outside of the capacitor can;
 wherein the first signal is different than the second signal; and
 wherein the IC sends signals to a display to display a color map to an operator that identifies whether the capacitor can is in a healthy state or an unhealthy state, or in a replacement state.

2. The monitoring system of claim 1, wherein the first signal is indicative of a voltage across a drain resistor or the one or more in the capacitor can, wherein the voltage is associated with a charge of the one or more capacitors.

3. The monitoring system of claim 2, wherein the monitoring system comprises an RFID or fiber optic communication system that corresponds to the voltage vector across the drain resistor or capacitance of the capacitor can.

4. The monitoring system of claim 1, wherein the first signal is indicative of a current vector into the capacitors within the can, wherein the current is associated with a charge of the one or more capacitors.

5. The monitoring system of claim 1, wherein the IC is configured to determine the value of the operating characteristic using an analog to digital (ADC) converter or optical signal processor that converts the first signal from the at least one sensor into the value.

6. The monitoring system of claim 1, wherein the antenna comprises a patch antenna configured to output radio signals at a frequency based on the operating characteristic.

7. The monitoring system of claim 1, wherein the at least one sensor comprises a voltage sensor, a current sensor, an acoustic sensor, a temperature sensor, a pressure sensor, a vibration sensor, a gas sensor, or any combination thereof.

8. The monitoring system of claim 1, wherein the second signal includes a set of frequencies based on the value of the operating characteristics.

9. A method, comprising:
 receiving, via an integrated circuit (IC), a first signal from at least one sensor indicative of an operating characteristic associated with health of one or more capacitors within a capacitor can;
 sending, via the IC, a second set of signals indicative of values of the operating characteristic to a receiving device outside of the capacitor can;
 wherein the second set of signals is configured to be transmitted from a patch antenna mounted on an exterior of the capacitor can to the receiving device;
 wherein the first signal is different than the second set of signals; and wherein the IC sends signals to a display to display a color map to an operator that identifies whether each capacitor can is in a healthy state or an unhealthy state, or in a replacement state.

10. The method of claim 9, comprising providing the first signal indicative of a temperature from an on-chip temperature sensor of the capacitor can to the IC.

11. The method of claim 9, wherein the second signal is used by a processor disposed on a reader to determine whether the capacitor can is in a replacement state.

12. The method of claim 11, wherein the capacitor can is in a replacement state when the value is less than at least one threshold.

13. The method of claim 9, comprising determining the value of the operating characteristic using an analog to digital (ADC) converter that converts signals from the at least one sensor into values indicative of the health of the capacitor can.

14. The method of claim 9, comprising sending the second signal via an optical fiber between the capacitor can and a second capacitor can.

15. A system, comprising:
a first monitoring system configured to monitor a first capacitor can of a plurality of capacitor cans in a capacitor bank, wherein the first monitoring system comprises:
at least one sensor configured to detect an operating characteristic associated with health of the first capacitor can and to output a sensor signal indicative of the operating characteristic; and
an integrated circuit (IC) operatively coupled to a memory, wherein the IC is configured to:
receive the sensor signal from the at least one sensor; and
control an optical signal between the first capacitor can and a second capacitor can to indicate the health of the first capacitor can;
wherein the first monitoring system comprises a voltage driven optical attenuator configured to control an amount of light transmitted across the optical fiber based on a voltage across a drain resistor of the first capacitor can; and
wherein the first monitoring system sets an alarm indicating a need to replace the first capacitor can if a power factor, as computed from the voltage across the drain resistor and a current through the drain resistor is outside of a threshold.

16. The system of claim 15, wherein the voltage across the drain resistor comprises a voltage vector having a magnitude and a phase angle.

17. The system of claim 15, wherein the first monitoring system is coupled to a second monitoring system of the second capacitor can via an optical fiber.

18. The system of claim 17, comprising a reading system configured to read optical signals from the optical fiber.

19. The system of claim 18, wherein the reading system comprises an optical time-domain reflectometer (OTDR) configured to detect a change in the optical signal at a location along the optical fiber indicative of the health of the first capacitor can.

20. The system of claim 17, wherein the optical fiber is daisy chained to a third monitoring system of a third capacitor can of the plurality of capacitor cans.

* * * * *